United States Patent [19]
Kelleher et al.

[11] Patent Number: 6,069,081
[45] Date of Patent: May 30, 2000

[54] TWO-STEP CHEMICAL MECHANICAL POLISH SURFACE PLANARIZATION TECHNIQUE

[75] Inventors: Kathryn Helen Kelleher, Danbury, Conn.; Matthias Peschke, Poughkeepsie; Hiroyuki Yano, Wappingers Falls, both of N.Y.

[73] Assignees: International Buiness Machines Corporation, Armonk, N.Y.; Siemens Components, Inc., Iselin, N.J.; Kabushiki Kaisha Toshiba, Kanagawa-ken, Japan

[21] Appl. No.: 08/430,972

[22] Filed: Apr. 28, 1995

[51] Int. Cl.$^7$ .................................................. H01L 21/302
[52] U.S. Cl. ........................................ 438/692; 438/785
[58] Field of Search ........................... 437/235, 238, 437/243, 244; 438/692, 785

[56] References Cited

U.S. PATENT DOCUMENTS

| | | | |
|---|---|---|---|
| 4,671,851 | 6/1987 | Beyer et al. | 156/645 |
| 4,735,679 | 4/1988 | Lasky | 156/636 |
| 5,244,534 | 9/1993 | Yu et al. | 156/636 |
| 5,334,281 | 8/1994 | Doerre et al. | 156/636 |
| 5,340,370 | 8/1994 | Cadien et al. | 51/308 |
| 5,356,513 | 10/1994 | Burke et al. | 156/636 |
| 5,362,669 | 11/1994 | Boyd et al. | 437/67 |
| 5,385,866 | 1/1995 | Bartush | 437/186 |
| 5,395,801 | 3/1995 | Doan et al. | 437/225 |
| 5,445,996 | 8/1995 | Kodera et al. | 437/225 |
| 5,459,096 | 10/1995 | Venkatesan et al. | 437/67 |
| 5,483,568 | 1/1996 | Yano et al. | 378/44 |
| 5,554,555 | 9/1996 | Rostoker et al. | 437/52 |

FOREIGN PATENT DOCUMENTS

| | | |
|---|---|---|
| 63-251164 | 10/1988 | Japan . |
| 6-163489 | 6/1994 | Japan . |
| 6-216096 | 8/1994 | Japan . |

OTHER PUBLICATIONS

Japanese Office Action, dated Oct. 12, 1999, with English language translation of Japanese Examiner's comments.

Mattox, Robert, "CMP Planarization Concerns Surrounding $CeO_2$ Slurry", 1046b Extended Abstracts, Fall Mtg (1993), Oct. 1995, New Orleans, vol. 93, No. 2, 1993, Pennington, NJ, U.S., pp. 291–292.

*Primary Examiner*—Benjamin L. Utech
*Attorney, Agent, or Firm*—Whitham, Curtis & Whitham; Daryl K. Neff, Esq.

[57] ABSTRACT

A method of planarizing a dielectric coating applied over an underlying structure on an integrated circuit wafer employs a two-step chemical mechanical polishing (CMP) process. The underlying structure is characterized as having elevated areas and recessed areas. The wafer can be prepared by applying a first polish stop on the elevated areas, then depositing a layer of dielectric over at least the recessed areas, and finally depositing a second polish stop over the resulting dielectric coating. In some applications a first polish stop is not required. The first step in the two-step CMP is polishing the second polish stop using a slurry that polishes the second polish stop until the second polish stop is substantially removed over the elevated areas. The second step is polishing the dielectric coating that remains using a second slurry that polishes the dielectric at a faster rate than it polishes either the second or first polish stop.

10 Claims, 2 Drawing Sheets

TWO-STEP CHEMICAL MECHANICAL POLISH SURFACE PLANARIZATION TECHNIQUE

BACKGROUND OF THE INVENTION

1. Field of the Invention

The present invention generally relates to the manufacture of semiconductor devices and, more particularly, to an improved planarization technique for integrated circuit wafers which produces improved planarity in the wafers in a shorter polish time.

2. Background Description

As semiconductor devices become increasingly smaller, it is ever more important to achieve a planar surface for successful lithography at the smaller line dimensions. Chemical mechanical polishing (CMP) is fast becoming the planarization technique of choice. However, there are many problems to overcome such as dishing and nonuniformity.

Despite using various conditions of a single step CMP, planarization remains a critical issue. Combinations of reactive ion etching (RIE) with CMP have also been tried but still do not achieve the desired level of planarization. The combination of RIE and CMP is expensive and complex, requiring many steps and a mask. What is needed is a simpler, less expensive planarization process, preferably not requiring a mask and providing better control of the planarization process.

SUMMARY OF THE INVENTION

It is therefore an object of the present invention to provide an improved method of chemical mechanical polishing that achieves better planarization as compared with current art.

It is another object of the invention to provide a planarization process which is simple, does not require a mask, and which provides better control of the planarization process.

It is yet another object of this invention to provide a process which allows for underfilling of the recessed areas, thus reducing overall costs by less deposition and less polish time.

According to the invention, there is provided a method of planarization of a conformal film deposited on a patterned wafer surface consisting of topographical variations. The underlying layer is characterized as having elevated areas and recessed areas. The wafer is first prepared by applying a first polish stop on the elevated areas, then depositing a layer of dielectric over at least the recessed areas, and finally depositing a second polish stop over the resulting dielectric coating. The first step in the two-step CMP is polishing the second polish stop using a slurry that attacks the second polish stop until the second polish stop is substantially removed. The second step is polishing the dielectric coating that remains using a second slurry that attacks the dielectric at a faster rate than it attacks either the second or first polish stop until the first polish stop is exposed. In this process, the second polish stop protects the recessed areas.

Another object of this invention is to provide a process whereby there is no first polish stop material. In this case, the dielectric material is deposited directly over the topographical structures with no polish stop material protecting them. A polish stop material is then deposited over at least the recessed areas. The objective of this polish is to planarize the dielectric but not to expose the underlying structures. Therefore, a stated amount of dielectric remains over the once elevated areas.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
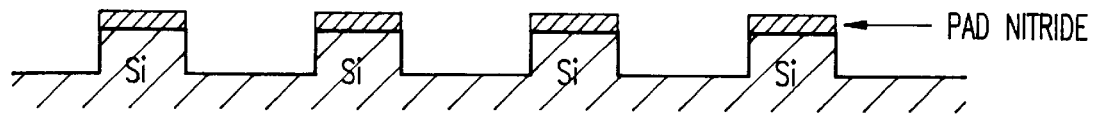
FIG. 1 is a cross-sectional view showing a silicon wafer patterned with trenches with silicon nitride applied to the upper surface areas.

The description of the invention will be made for a simple case example. This example starts with a silicon wafer which has been patterned with trenches, thus having elevated and recessed areas. To protect the silicon from later processing and to provide for an end point detection after CMP, a film of silicon nitride is formed on the elevated surface areas, to provide the structure shown in the cross-section of FIG. 1. This is referred to as the pad nitride. In the alternative approach, this first polish stop is not required.

Figure 2:
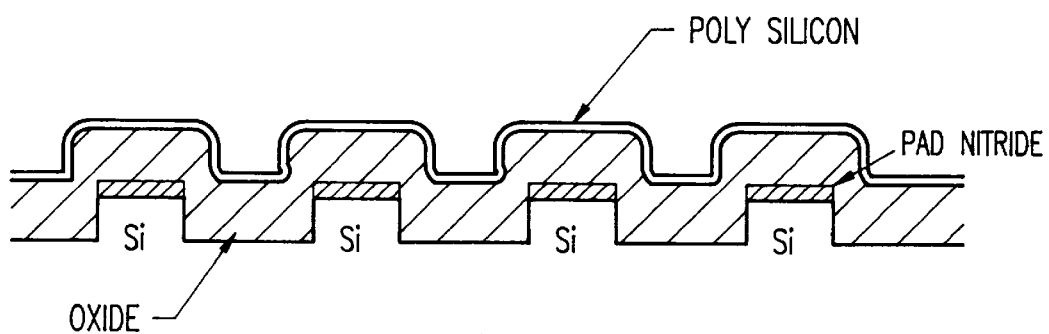
FIG. 2 is a cross-sectional view showing the silicon wafer of FIG. 1 having a thick oxide layer and a blanket layer of polysilicon applied.

Next, a thick film of material, such as oxide, is deposited to a sufficient thickness to cover the recessed areas. Over this material, a blanket layer of polysilicon, or other appropriate material, is deposited over the entire wafer to produce the structure shown in the cross-section of FIG. 2.

Figure 3:
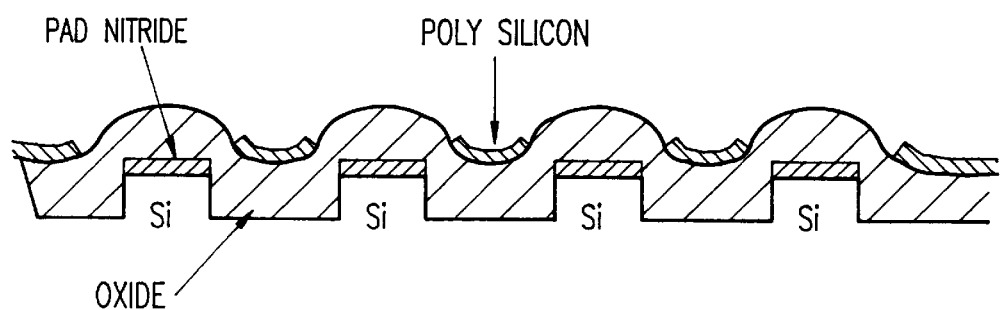
FIG. 3 is a cross-sectional view showing the silicon wafer of FIG. 2 after the first CMP step according to the invention.

The first CMP step is performed using a polysilicon slurry that is highly selective to oxide. Alternatively, a slurry having either similar or reverse polish rates for oxide and polysilicon may be used. The end point of the first CMP step can be determined by time, visible inspection, and/or step height measurement. The goal of this first step is to remove the polysilicon from the elevated areas and leave polysilicon in the recessed areas as shown in FIG. 3.

The process continues with the second CMP step using a ceria slurry, or any slurry with sufficient selectivity between polysilicon and oxide. Since the polishing rate of oxide in ceria is much faster than that for the polysilicon, the recessed areas still covered with polysilicon are protected during the polish. In this manner, planarization can be achieved.

End point detection can be monitored by time and/or measurement of the pad nitride thickness. Another approach to end point detection involves changes in friction that occur during polishing of different materials, in this case, oxide to nitride. This can be done by monitoring changes in the motor currents for the platter and carrier. Yet another approach for end point detection is monitoring and detecting frequency changes.

Figure 4:
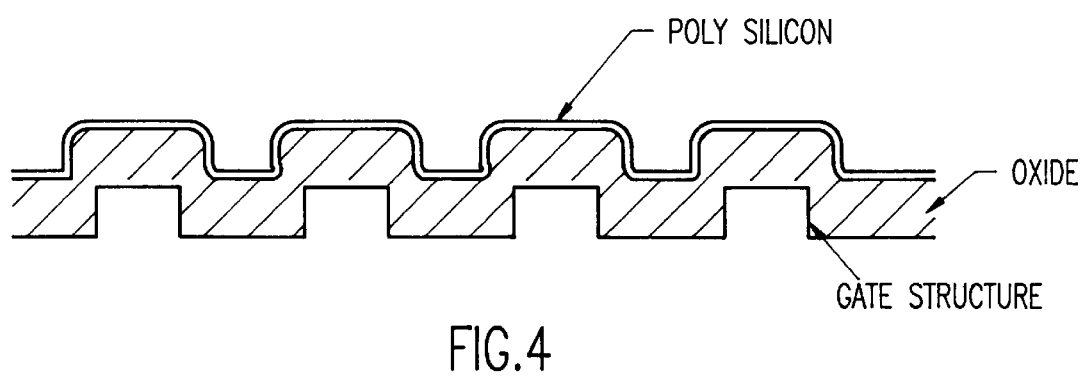
FIG. 4 is a cross-sectional view showing a silicon wafer with a gate contact structure.
Figure 5:
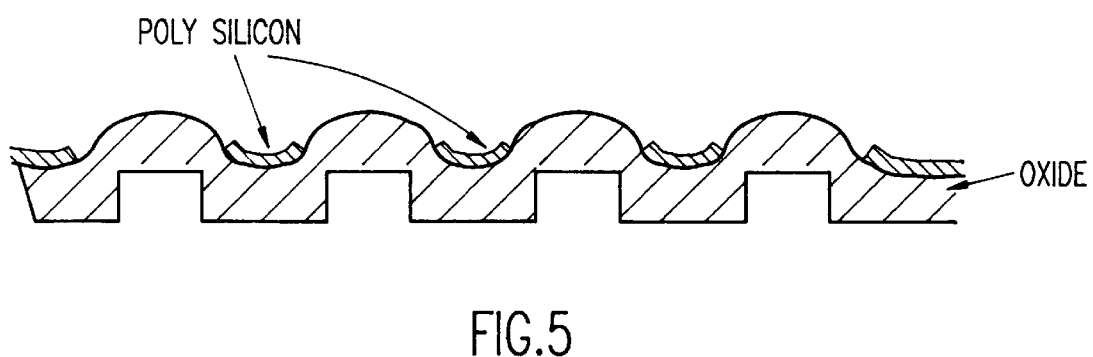
FIG. 5 is a cross-sectional view showing the silicon wafer of FIG. 4 after the first CMP step according to the invention.

Besides being useful for front-end-of-line applications, such as the shallow trench isolation example described above, the technique according to the invention is extendable to middle and back-end-of-line planarizations. FIG. 4 is a cross-sectional view of a gate contact (GC), showing the elevated areas as the gate structure. A colloidal silica slurry is used in the first CMP step to produce the structure shown in FIG. 5. This is followed by the second CMP step with a ceria, or other high selectivity slurry. Therefore, the technique according to the invention is adaptable for both types of polish; one which incorporates two polish stops (over elevated and recessed areas) and the other which requires only one polish stop (over recessed areas only).

While the invention has been described in terms of preferred and alternative embodiments, those skilled in the art will recognize that the invention can be practiced with modification within the spirit and scope of the appended claims.

What is claimed is:

1. A method of planarizing a dielectric coating applied over an underlying structure on an integrated circuit wafer, said underlying structure having elevated and recessed areas, the method comprising the steps of:

applying a first polish stop on said elevated areas;

depositing over said underlying structure a conformal layer of dielectric wherein said deposited conformal layer of dielectric has a thickness which is less than or equal to a step height of the underlying structure, said conformal layer of dielectric extending into said recessed areas and over said elevated areas of said underlying structure;

depositing a second polish stop over the conformal layer of dielectric;

polishing said second polish stop using a first slurry until said second polish stop is substantially removed over the elevated areas; and polishing said dielectric using a second slurry which is different from said first slurry and which polishes said dielectric at a faster rate than either said second or first polish stop until said first polish stop is exposed, whereby said second polish stop protects said dielectric in said recessed areas.

2. The method of planarizing a dielectric coating as recited in claim 1 wherein the first slurry used in said step of polishing said second polish stop polishes said second polish stop at a faster rate than the dielectric.

3. The method of planarizing a dielectric coating as recited in claim 1 wherein the first slurry used in said step of polishing said second stop has either a similar or a slower polish rate for the second polish stop as compared to the dielectric.

4. The method of planarizing a dielectric coating as recited in claim 1 wherein said second slurry used for polishing said dielectric coating is ceria.

5. The method of planarizing a dielectric coating as recited in claim 4 wherein the step of polishing said second polish stop is performed using a polysilicon slurry as said first slurry.

6. A method of planarizing a dielectric coating applied over an underlying structure on an integrated circuit wafer, said underlying structure having elevated areas and recessed areas, the method comprising the steps of:

depositing over said underlying structure a conformal layer of dielectric wherein the deposited conformal layer of dielectric has a thickness that is equal to or less than a step height of the underlying structure, said conformal layer of dielectric extending into said recessed areas and over said elevated areas of said underlying structure;

depositing a polish stop over the conformal layer of dielectric;

polishing said polish stop using a first slurry until said polish stop is substantially removed over the elevated areas; and polishing said dielectric using a second slurry that is different from said first slurry and which polishes said dielectric at a faster rate than said polish stop until a planar surface is achieved, whereby said polish stop protects said dielectric in said recessed areas.

7. The method of planarizing a dielectric coating recited in claim 6 wherein the step of polishing said dielectric proceeds until no polish stop remains in the recessed areas.

8. The method of planarizing a dielectric coating recited in claim 6 wherein said first slurry used in said step of polishing said polish stop polishes said polish stop at a faster rate than the dielectric.

9. The method of planarizing a dielectric coating recited in claim 8 wherein the second slurry used in the step of polishing said dielectric coating is ceria.

10. The method of planarizing a dielectric coating as recited in claim 6 wherein the first slurry used in the step of polishing said polish stop has either a similar or a slower polish rate for the polish stop as compared to the dielectric.

* * * * *

UNITED STATES PATENT AND TRADEMARK OFFICE
CERTIFICATE OF CORRECTION

PATENT NO. : 6,069,081
DATED : May 30, 2000
INVENTOR(S) : Katheryn H. Kelleher, Matthias Peschke, Hiroyuki Yanno It is certified that error appears in the above-identified patent and that said Letters Patent are hereby corrected as shown below:

In the list of Assignees, change "International Buiness Machines Corporation" to read --International Business Machines Corporation--.

Signed and Sealed this

Twenty-second Day of May, 2001

Attest:

NICHOLAS P. GODICI

*Attesting Officer*     *Acting Director of the United States Patent and Trademark Office*